United States Patent [19]

Foley et al.

[11] Patent Number: 5,062,384
[45] Date of Patent: Nov. 5, 1991

[54] VACUUM CHUCK ROTARY SEAL

[75] Inventors: Thomas P. Foley, Stony Brook; Roger Mosciatti, Coram, both of N.Y.

[73] Assignee: MFM Technology, Inc., Ronkonkoma, N.Y.

[21] Appl. No.: 435,259

[22] Filed: Nov. 13, 1989

[51] Int. Cl.⁵ .............................................. B05C 13/00
[52] U.S. Cl. ........................................ 118/500; 279/3; 51/235; 269/21
[58] Field of Search ....................... 279/3, 1 Q; 269/21; 51/235; 408/76; 409/225; 118/500.52, 503; 901/40, 28; 414/737, 752

[56] References Cited

U.S. PATENT DOCUMENTS

| 1,041,028 | 10/1912 | Church | 269/21 X |
|---|---|---|---|
| 1,130,679 | 3/1915 | Staunton | 269/21 X |
| 1,198,402 | 9/1916 | Baynall | 269/21 X |
| 2,366,935 | 1/1945 | Schmid | 409/225 X |
| 2,398,954 | 4/1946 | Petry | 269/21 X |
| 2,792,810 | 5/1957 | Maconeghy et al. | 269/21 X |
| 3,487,748 | 1/1970 | Grage | 409/136 |
| 3,538,883 | 11/1970 | Polin | 82/165 X |
| 3,731,435 | 5/1973 | Boettcher et al. | 51/235 X |
| 4,110,937 | 7/1978 | Bein | 51/235 X |
| 4,183,545 | 1/1980 | Daly | 269/21 X |
| 4,194,324 | 3/1980 | Bonora et al. | 269/21 X |
| 4,535,721 | 8/1985 | Yakura | 118/503 |

FOREIGN PATENT DOCUMENTS

| 122367 | 10/1946 | Australia | 279/3 |
|---|---|---|---|
| 2531134 | 1/1976 | Fed. Rep. of Germany | 51/235 |
| 399803 | 11/1942 | Italy | 51/235 |

Primary Examiner—Paula A. Bradley
Assistant Examiner—Robert Schultz
Attorney, Agent, or Firm—Howard C. Miskin

[57] ABSTRACT

A vacuum chuck apparatus includes a vacuum chuck mounted on one end of a hollow shaft whose other end is connected through a rotary seal to a vacuum source. The seal includes a first member having a cap portion cemented to the shaft end and an axially bored frustoconical projection on its end wall and a second member having a frustoconical socket complementing the projection which partially nests in the socket. The second member has a radial pin loosely engaging a longitudinal slot in a stationary bracket to restrict its rotation and permit its axial movement. A spring loaded pressure plate bears on the outer end face of the seal second member.

10 Claims, 4 Drawing Sheets

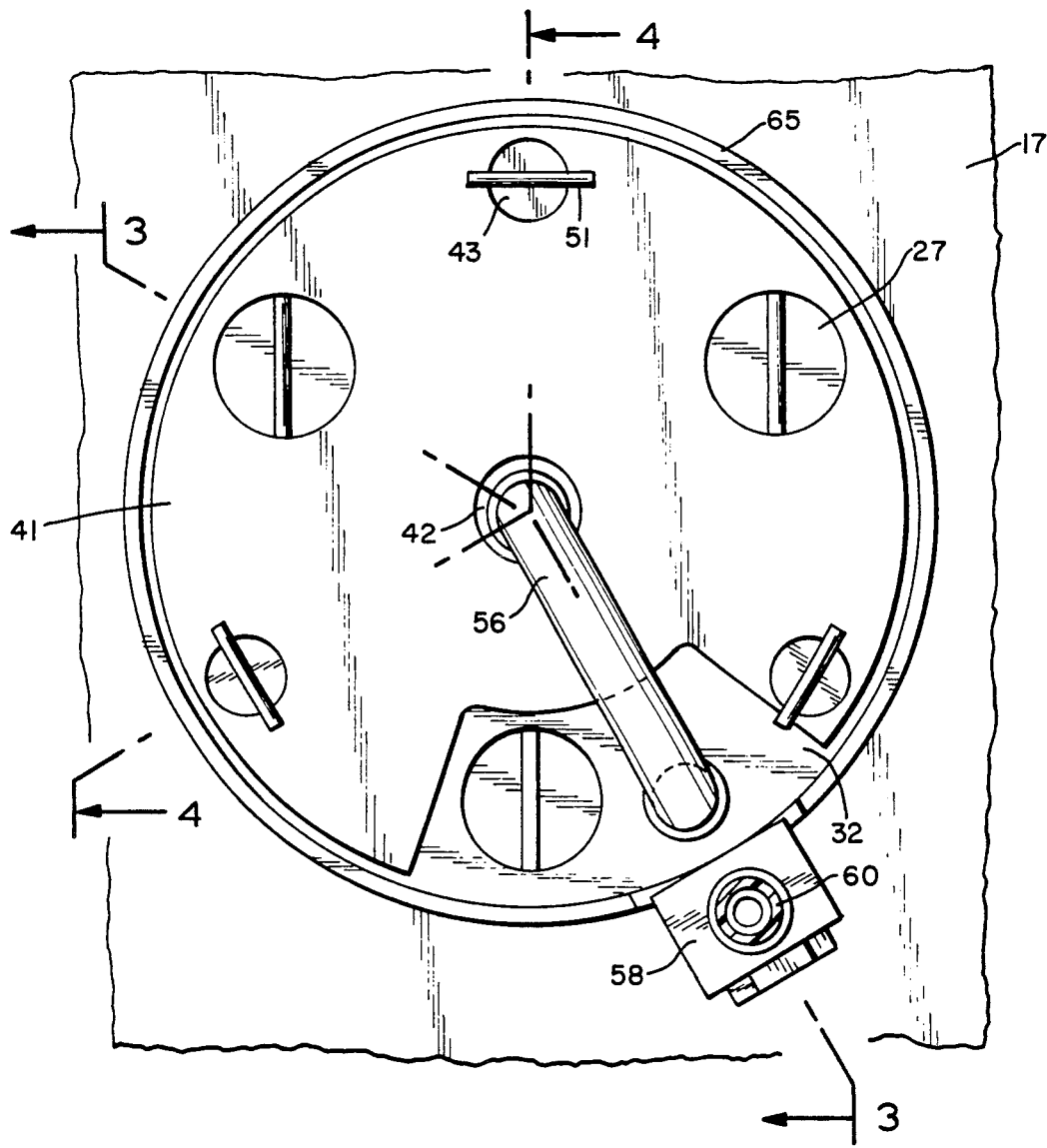
F I G. 2

VACUUM CHUCK ROTARY SEAL

BACKGROUND OF THE INVENTION

The present invention relates generally to improvements in devices and machines for handling and treating work pieces and it relates particularly to an improved vacuum chuck device.

In many manufacturing processes such as in the spinning of wafers, masks and microelectrical substrates, for example in the application of coating materials to a substrate, typically a thin wafer, it is often necessary to retain the work piece, for example the thin wafer, on a rotating chuck. It is a common procedure where the work piece is of a fragile or delicate nature and where the work piece should be rapidly secured to or separated from the chuck that a vacuum chuck is employed, that is, a chuck in which suction is applied to the rear face of the work piece and the work piece is retained on the chuck under the influence of the atmospheric or ambient pressure. The chuck is accordingly connected to a vacuum pump or tank by way of a hollow motor drive shaft on which the chuck is mounted. To this end, the shaft bore is connected by way of a rotatable pneumatic coupling to the vacuum source. The rotatable couplings heretofore employed possess many drawbacks and disadvantages. They are unreliable, awkward, introduce variations in smoothness, and inefficient devices which are frequently short lived, bulky and expensive and subject to leakage and are of little versatility and otherwise leave much to be desired.

SUMMARY OF THE INVENTION

It is a principal object of the present invention to provide an improved mechanism for holding and moving a work piece attendant to the treatment thereof.

Another object of the present invention is to provide an improved rotating work holding chuck.

A further object of the present invention is to provide an improved vacuum chuck which can retain delicate work pieces attendant to the treatment thereof such as wafers, masks, microelectric substrates, with great precision and with no damage or injury to the work piece.

Still a further object of the present invention is to provide an improved rotatable vacuum coupling or commutator between a hollow shaft and a vacuum source which provides a high degree of smoothness in rotation.

Another object of the present invention is to provide an improved vacuum coupling or seal which is simple, inexpensive, rugged, highly efficient, of great durability and self adjusting and of great versatility and adaptability.

The above and other objects of the present invention will become apparent from a reading of the following description taken in conjunction with the accompanying drawings which illustrate a preferred embodiment thereof.

A rotating vacuum coupling or commutator in accordance with the present invention includes a pair of relatively rotatable and relatively axially movable first and second coupling sections one of which is rotatable and communicates with a work holding chuck and the other is limited in rotation and connected to a vacuum source. One of the coupling sections includes a conical socket and the other section includes an axially bored conical projection at least partially nesting in and rotatably engaging the face of the socket, the base of the socket and apex of the projection being foreshortened and axially spaced. Thus, one of the coupling sections axially moveably floats relative to the other section and the sections and are retained in mutual engagement under the influence of atmospheric pressure upon the application of reduced pressure to the coupling passageway. In addition, spring means are provided resiliently urging the coupling sections into mutual engagement, so as to be engaged in a sealing manner when there is no workpiece on the chuck and therefore no vacuum pressure.

In a vacuum chuck employing the improved coupling, the chuck member is mounted on one end of an axially bored motor-driven hollow shaft, the other end of which is connected to the projection or male coupling section. A bracket is located on an end wall of the motor housing and has a longitudinally extending recess in a wall thereof which is slidably engaged by a pin radially projecting from the socket coupling section. A bias plate bears on the outer face of the socket coupling section and is urged toward the projection coupling section by tension springs extending between the bracket forward section and the bias plate. A flexible vacuum tube extends between tube fittings on the bracket and socket coupling section. The tip of the conical projection and the base of the socket are flatted and parallel.

The improved vacuum coupling and vacuum clutch are rugged, simple, efficient and of great durability and are of great versatility and adaptability.

BRIEF DESCRIPTION OF THE DRAWINGS

FIG. 2 is a partial front end view thereof;

DESCRIPTION OF THE PREFERRED EMBODIMENT

Figure 1:
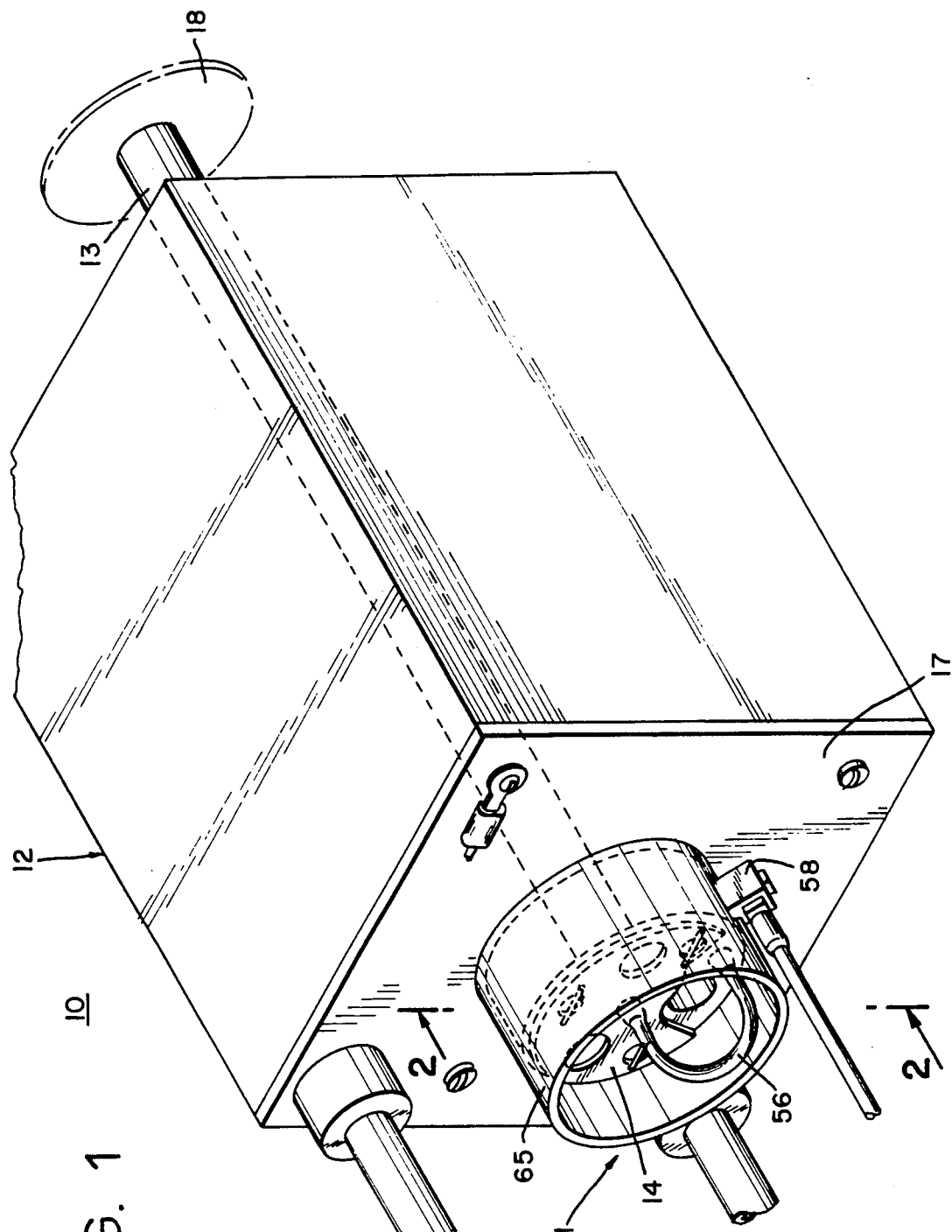
FIG. 1 is a front end perspective view of a vacuum chuck apparatus embodying the present invention.
Figure 3:
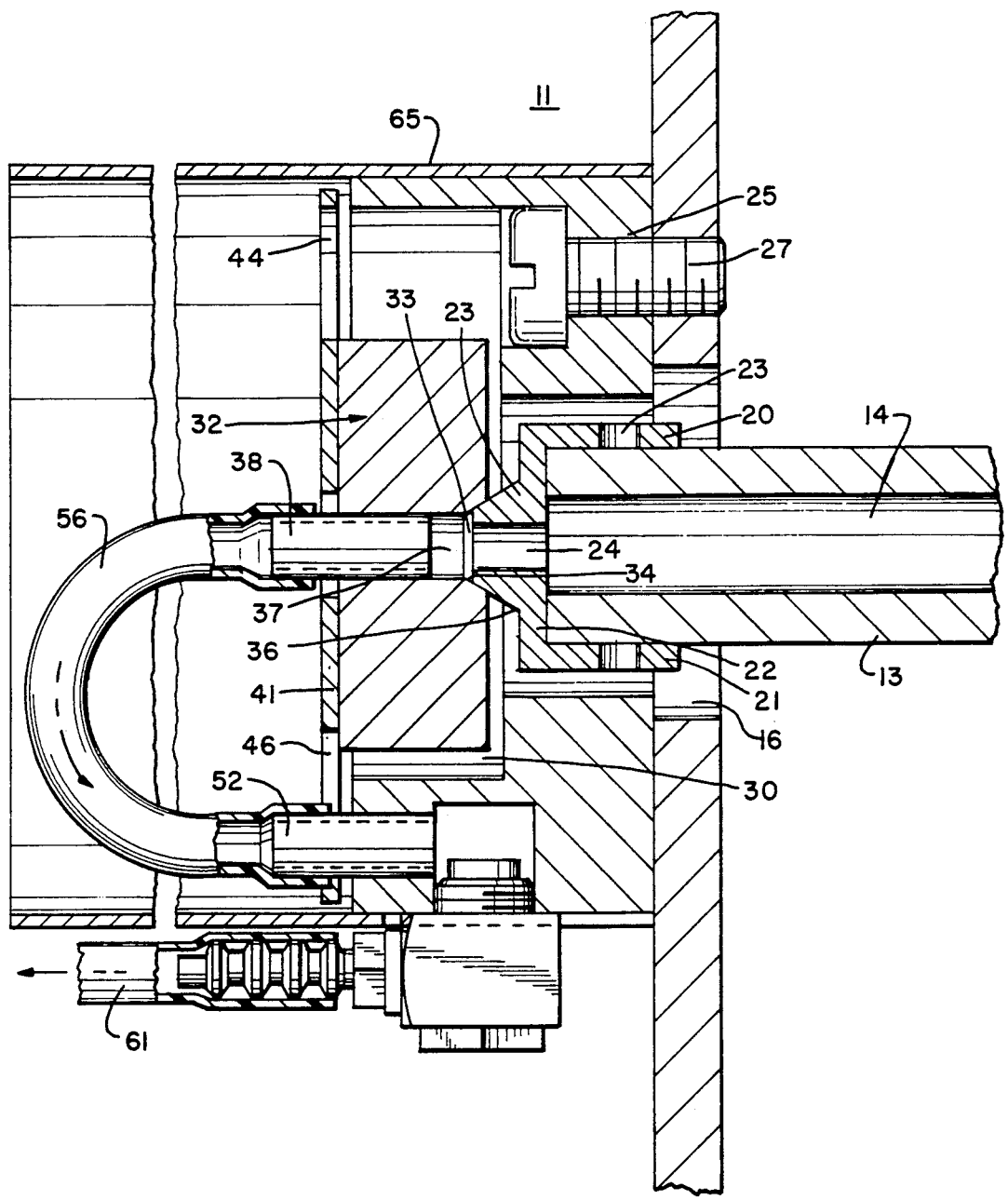
FIG. 3 is a sectional view taken along line 3—3 in FIG. 2.
Figure 4:
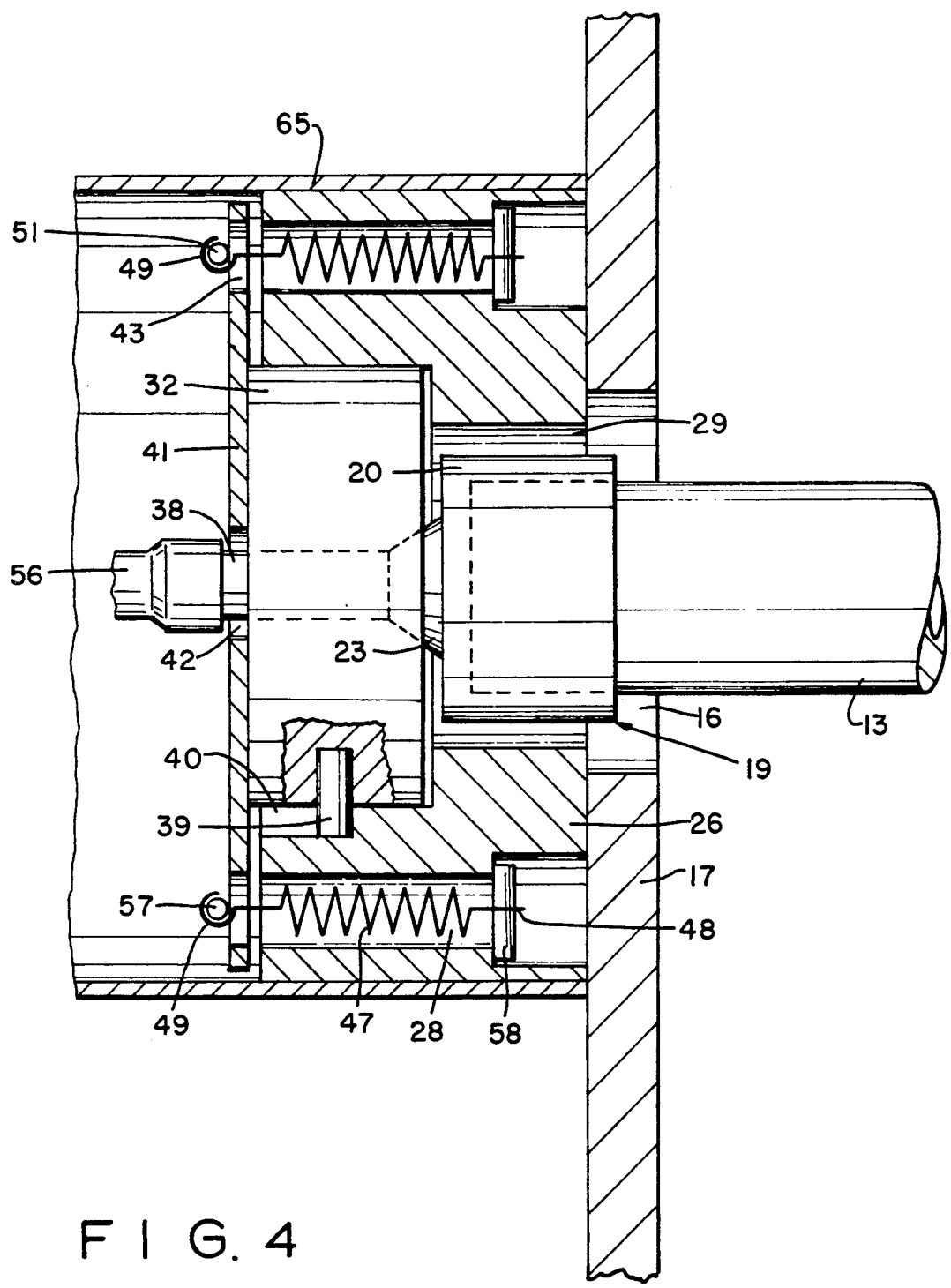
FIG. 4 is a sectional view taken along line 4—4 in FIG. 2.

Referring now to the drawings which illustrate a preferred embodiment of the present invention, the reference number 10 generally designates the improved vacuum chuck mechanism employing a vacuum or low pressure pneumatic coupling seal or device 11 in accordance with the present invention. The vacuum chuck mechanism 10 includes a casing 12 housing a suitable electric motor which rotates a hollow drive shaft 13 which has a longitudinal axial through bore or passageway 14. The shaft 13 extends out of one end of casing 12 through a central circular opening 16 in an end wall 17 of casing 12 and projects through the opposite end wall of casing 12 and carries and communicates with a chuck 18 of any suitable or known construction for suction retaining a work piece.

The rotatable male coupling section 19 of vacuum coupling device 11 is coaxial with and is affixed to the end of shaft 13 projecting through opening 16 and includes a cap portion 20 having a cylindrical peripheral wall 21 engaging the outer face of shaft 13 and a circular end wall 22 abutting the shaft end face. Cap portion 20 is cemented with a suitable adhesive to shaft 21 to permit the replacement of coupling section 10 with differently dimensioned coupling sections. Openings 23a are provided in cap wall 21 to facilitate such cementing and replacement.

A frustoconical coupling tip or projection 23 extends from the outside face of cap wall 22 and is coaxial with shaft 13 and wall 22 and is provided with an axial bore 24 communicating with shaft bore 14 and the outer end of projection 23. The apex of projection 23 is transversely flat and the average radius of projection 23 is considerably less than that of shaft 13.

Mounted on the outside face of casing end wall 17 and coaxial with opening 16 is a cylindrical bracket 26 secured to wall 17 by a plurality of screws 27 engaging peripherally spaced counter-bored opening 25 in bracket 26 and tapped corresponding openings in casing end wall 17. Also formed in bracket 26 are a plurality of peripherally spaced spring housing bores 28 enlarged at the ends proximate casing end wall 17. Coupling section 19 is coaxially located in an inner cylindrical opening 29 in bracket 26 coaxial with casing wall opening 16 and of greater diameter than coupling section 19 and communicating with an enlarged cylindrical opening 30 extending to the outer face of bracket 26.

A cylindrical second coupling section 32 coaxial with shaft 13 is located in and projects shortly beyond opening 30 and has an axial socket 33 formed in the inner end face and has a conical peripheral face 34 mating and complementing the conical face 36 of projection 23. Projection 23 nests in and rotatably engages socket 32 with its flatted end face located above the base or bottom of socket 33. An axial bore 37 is formed through coupling section 32 and communicates with the bottom of socket 33 and a coupling pipe 38 engages bore 37 and projects beyond the outer face of coupling section 32.

Coupling section 32 floats to a limited extent relative to coupling section 19 in that it is axially movable relative thereto. Moreover, coupling section 32 is rotatable a limited angle as restricted by a pin 39 affixed to and radially projecting from coupling section 32 into registry with a longitudinal slot 40 in bracket 26 of greater width than pin 39.

A circular pressure plate 41 of slightly less diameter than the outside diameter of bracket 26 bears on the underface of coupling section 32 and has a central opening 42 of greater diameter than that of pipe 38 through which pipe 38 extends. Also formed in plate 41 are circular openings 43 which axially register with bracket bores 28, circular openings 44 axially aligned with screw bores 25 to provide access to screws 27 and a peripheral opening 46 providing access to a part of the end face of bracket 26. Housed in each of the bores 28 is a longitudinally extending helical tension spring 47 terminating at opposite ends in connector hooks 48 and 49 respectively. A first pin 50 abuts the inner shoulder of each bore 28 and is engaged by a respective spring hook 48 and a second pin 51 abuts the underface of the border of each opening 43 and is engaged by a respective spring hook 49 to maintain springs 47 under tension and urge or bias pressure plate 41 into pressure engagement with the outer end face of coupling or seal section 32.

The conical faces of projection 23 and socket 33 are highly polished and the seal or coupling sections 19 and 33 are preferably each integrally formed of different materials to effect minimum wear and friction. Thus, section 20 is advantageously formed of stainless steel and section 33 is advantageously formed of a chemically relatively inert plastic material having a low coefficient of friction and generally good temperature stability.

A pipe 52 similar to pipe 38 extends through a longitudinal bore in the wall of bracket 26 and through opening 46 in pressure plate 41. The pipe 52 communicates with a cavity 53 in the bracket wall and is connected at its outer end to pipe 38 by a flexible pressure-resistant tube 56 in the form of a U-shaped loop.

One leg 57 of a tubular L-shaped fitting 58 is threaded and engages a transverse tapped side opening to cavity 53 and the other longitudinally extending leg of 59 of fitting 58 terminates in a peripherally ridged elongated nipple 60. Nipple 60 is engaged by a flexible suction tube 61 which is connected to a vacuum source such as a suction pump, vacuum tank or the like. A cylindrical shell 65 engages the outer face of bracket 26 and extends beyond tube 56 to house the seal and coupling assembly and is provided with a longitudinal slot 66 to afford clearance for fitting 58.

In the operation of the vacuum chuck, the pipe is connected to the vacuum source to evacuate shaft bore 14 by way of the seal assembly of coupling sections 19 and 32, pipes 38 and 52, tubes 56 and 61 and fitting 58. A work piece is applied to and retained on chuck 18 by suction consequent to the reduced pressure in shaft bore 14. The shaft 13 is driven by the energized shaft drive motor to rotate vacuum chuck 18 and the suction retained work piece which is then treated as desired. The seal sections 19 and 32 are retained in low friction relative rotating coupled condition by the difference between the ambient atmospheric pressure and the seal reduced internal pressure and springs 47, the interface between projection 23 and socket 33 being gas tight and leak resistant. Any wear of the relatively rotating seal conical faces does not interfere with the efficacy of the seal and its low resistance to relative rotation of the seal sections since such wear is compensated by the axial self adjustment of the floating seal sections under the influence of the difference in internal and external ambient pressure and springs 47. Moreover, any vibration and deviation from optimum and precision position, dimensions and relationships is overcome by the limited floating of seal section 32. In the event of a failure or deficiency in the vacuum system, the seal is properly maintained by closure biasing of the seal sections under the influence of tension springs 47 and pressure plate 41.

While there has been described and illustrated a preferred embodiment of the present invention, it is apparent that numerous alterations, omissions and additions may be made without departing from the spirit thereof.

We claim:

1. A rotary device comprising a motor having an axially bored drive shaft, a vacuum chuck mounted on one end of said shaft; a first seal member mounted on the other end of said shaft opposite said chuck end; a floating second seal member of restricted rotation; means mounting said second seal member coaxial with said first seal member and longitudinally movable relative thereto and for restricting its rotation; one of said seal members having formed therein an axial socket with a first conical face terminating in a base at its inner end and having a bore communicating with said socket and the other seal member having an axial projection with a second conical face nesting in said socket and superimposed on and slidably engaging said first conical face and provided with an axially extending bore, the apex of said projection being axially spaced from said base of said socket; means connecting one of said bores to a vacuum source and means for axially resiliently biasing said seal members toward each other to urge said first and second faces into mutual engagement.

2. The device of claim 1 wherein said second conical face of said projection and said socket are of frustoconical configuration.

3. The device of claim 1 wherein said mounting means comprises a bracket mounted on said housing and having a bore with an inner face confronting said second seal member, said member and said means for restricting the rotation of said second seal member including a longitudinally extending recess and a follower engaging said recess located on the confronting faces of said second seal member and bracket.

4. The device of claim 3 wherein said biasing means comprise a transverse pressure plate bearing on an end face of said second seal member opposite said first seal member and tension springs extending longitudinally between said pressure plate and said bracket to urge said pressure plate toward said second seal member.

5. A rotary vacuum chuck apparatus comprising a motor housing; a longitudinally axially bored hollow motor drive shaft extending through and projecting beyond said housing; a vacuum chuck member mounted on one end of said shaft; a first vacuum seal member mounted on and rotatable with the other end of said shaft proximate a first end face of said housing and said first vacuum seal member including a conical projection coaxial with said shaft and having an axial bore; a floating second seal member of restricted rotation and having a conically shaped axial socket spaced proximate said first seal member and an axial bore communicating with said socket, said first seal member conical projection nesting in said socket and having an apex spaced from the base of said socket; spring-loaded means axially biasing said second seal member toward said first seal member; means limiting the rotation of said second seal member; and means providing communication between said socket and a vacuum source.

6. The apparatus of claim 5 wherein said biasing means includes a pressure plate bearing on an outer end face of said second seal member remote from said cavity and a plurality of peripherally spaced longitudinal tension springs, having opposite ends anchored to said housing and pressure plate respectively.

7. The apparatus of claim 5 wherein said means restricting rotation comprises a bracket mounted on said housing and extending longitudinally, and a follower projecting radially from said second seal member and slidably engaging a longitudinal recess in said bracket.

8. The apparatus of claim 5 wherein said communication means comprises a bracket mounted on said housing, a longitudinal first pipe engaging said second seal member bore, a second longitudinal pipe supported by said bracket, a flexible tube extending between said pipes and tube coupling means supported by said bracket communicating with said second pipe.

9. The apparatus of claim 5 wherein said first seal member comprises a cap section including a cylindrical peripheral wall engaging and secured to said other end of said shaft and a circular end wall integrally formed with said projection.

10. The apparatus of claim 5 wherein the maximum diameter of said projection is less than the outside diameter of said shaft.

* * * * *